(12) United States Patent
Min

(10) Patent No.: US 8,258,832 B2
(45) Date of Patent: Sep. 4, 2012

(54) LOOP FILTER AND PHASE LOCKED LOOP INCLUDING THE SAME

(75) Inventor: Byung Hun Min, Jeonlabuk-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 9 days.

(21) Appl. No.: 12/860,498

(22) Filed: Aug. 20, 2010

(65) Prior Publication Data

US 2011/0115535 A1    May 19, 2011

(30) Foreign Application Priority Data

Nov. 19, 2009    (KR) .................. 10-2009-0111880

(51) Int. Cl.
    *H03L 7/06*    (2006.01)
(52) U.S. Cl. ........................ 327/156; 327/558
(58) Field of Classification Search .......... 327/147, 327/148, 156, 157, 552, 558
    See application file for complete search history.

(56) References Cited

U.S. PATENT DOCUMENTS

| 5,170,130 | A  | * | 12/1992 | Ichihara ...................... 327/157 |
| 6,320,435 | B1 | * | 11/2001 | Tanimoto ...................... 327/156 |
| 7,078,948 | B2 | * | 7/2006  | Dosho .......................... 327/157 |
| 7,091,759 | B2 |   | 8/2006  | Sowlati et al. |
| 7,283,004 | B2 |   | 10/2007 | Guenais |
| 7,355,463 | B2 | * | 4/2008  | Sowlati et al. .................. 327/157 |
| 7,498,888 | B2 | * | 3/2009  | Nitsche et al. ................... 331/17 |
| 7,692,458 | B1 | * | 4/2010  | Eker ............................. 327/148 |
| 7,777,577 | B2 | * | 8/2010  | Jennings et al. ................. 331/17 |

OTHER PUBLICATIONS

Jan Craninckx et al., "A Fully Integrated CMOS DCS-1800 Frequency Synthesizer", IEEE Journal of Solid-State Circuits, vol. 33, No. 12, pp. 2054-2065, Dec. 1998.

* cited by examiner

*Primary Examiner* — Jeffrey Zweizig
(74) *Attorney, Agent, or Firm* — Rabin & Berdo, P.C.

(57) ABSTRACT

Provided is a loop filter which receives first and second currents whose current ratio is n (where n is a natural number). The loop filter includes a first-order filter path, a second-order filter path, and a third-order filter path. The first-order filter path includes an operational amplifier generating an output impedance by increasing by as much as n times an impedance of a second input node to which the second current is applied. The first-order filter path performs a first-order filtering on the first current applied to a first input node by using the operational amplifier. The second-order filter path performs a second-order filtering on the first current applied to the first input node. The third-order filter path performs a third-order filtering on the first current applied to the first input node.

13 Claims, 8 Drawing Sheets

LOOP FILTER AND PHASE LOCKED LOOP INCLUDING THE SAME

CROSS-REFERENCE TO RELATED APPLICATIONS

This application claims the priority of Korean Patent Application No. 10-2009-0111880 filed on Nov. 19, 2009, in the Korean Intellectual Property Office, the disclosure of which is incorporated herein by reference.

BACKGROUND OF THE INVENTION

1. Field of the Invention

The present invention relates to a loop filter for the on-chip integration of a frequency mixer, and more particularly, to a loop filter and a phase locked loop including the same, which are capable of reducing chip area by 50% or more, while providing the same performance as the existing capacitor, by replacing a high-capacitance capacitor being a passive element with a low-capacitance capacitor and an operational amplifier in designing a third-order loop filter for a phase locked loop of a frequency mixer.

2. Description of the Related Art

Frequency mixers are widely used to generate stable frequencies for transmission/reception in the fields of mobile communications.

In such frequency mixers, a phase locked loop (PLL) including a charge pump mainly uses a third-order loop filter for the purpose of a stable phase lock.

As illustrated in FIG. 1, a typical phase locked loop includes a phase detector 110, a charge pump 120, a loop filter 130, a voltage controlled oscillator (VCO) 140, and a divider 150. The loop filter 130 is implemented with a third-order loop filter illustrated in FIG. 2. Specifically, the loop filter 130 includes a first resistor $R_1$ and a first capacitor $C_1$ connected in series between an output terminal of the charge pump 120 and a ground terminal, a second capacitor $C_2$ connected in parallel to the first resistor $R_1$ and the first capacitor $C_1$, a third resistor $R_3$ connected between the output terminal of the charge pump 120 and an input terminal of the voltage controlled oscillator 140, and a third capacitor $C_3$ connected between the input terminal of the voltage controlled oscillator 140 and the ground terminal.

The first resistor $R_1$ and the first capacitor $C_1$ of the loop filter 130 determine a zero frequency ($\omega_z$) of the phase locked loop, and the first resistor $R_1$ and the second capacitor $C_2$ determine a pole frequency ($\omega_p$) of the phase locked loop.

In order for the loop filter 130 to obtain a sufficient phase margin, the capacitance of the first capacitor $C_1$ determining the zero frequency ($\omega_z$) of the phase locked loop must be large.

For example, when a phase margin of the phase locked loop is 57 degrees; an open loop unit gain frequency ($\omega_c$) is 32 KHz; an oscillation frequency ($F_{VCO}$) is 2 GHz; a reference frequency ($F_{ref}$) is 25 MHz; a division ratio (N) is 80; a VCO gain ($K_{VCO}$) is 50 KH; and an output current ($I_{cp}$) of the charge pump is 20 μA, the first resistor $R_1$, the first capacitor $C_1$, and the second capacitor $C_2$ in the loop filter of FIG. 2 are 17 kΩ, 1 nF, and 80 pF, respectively.

However, these element values of the loop filter have two problems.

First, the capacitor having a capacitance of 1 nF or more occupies a large chip area when it is integrated. When assuming that the capacitance corresponding to 1 μm² is 1 nF, an integrated circuit area of 1 mm² is required when 1-nF capacitance is implemented by using a metal-insulator-metal (MIM) capacitor. This may cause an increase in chip areas and chip costs.

Second, the element values of the passive elements inside the loop filter have about a 20% error rate due to variations in process and temperature when they are integrated. This may seriously degrade a phase margin of a phase locked loop.

Therefore, a loop filter is usually designed with an open chip and implemented on a printed circuit board (PCB) by using chip capacitors and chip resistors, whose absolute element values are less than 1%. However, the open chip design may increase costs of individual frequency mixer parts due to an increase in number of chip resistors, chip capacitors, and wire bondings.

SUMMARY OF THE INVENTION

An aspect of the present invention provides a loop filter and a phase locked loop including the same, which are capable of reducing chip area and achieving on-chip integration by replacing a charge pump and a first capacitor having a large element value included in a conventional loop filter with a dual charge pump, a first capacitor having a small element value, and an operational amplifier.

An aspect of the present invention also provides a loop filter and a phase locked loop including the same, which are capable of obtaining an optimal phase margin even though process and temperature are changed when it is integrated.

According to an aspect of the present invention, there is provided a loop filter, which receives first and second currents whose current ratio is n (where n is a natural number), the loop filter includes: a first-order filter path including an operational amplifier generating an output impedance by increasing by as much as n times an impedance of a second input node to which the second current is applied, the first-order filter path performing a first-order filtering on the first current applied to a first input node by using the operational amplifier; a second-order filter path performing a second-order filtering on the first current applied to the first input node; and a third-order filter path performing a third-order filtering on the first current applied to the first input node.

The first-order filter path may include: a first resistor having one terminal connected to the first input node; a first capacitor connected between the second input node and a ground terminal; and an operational amplifier having input terminals connected to the second input node and the ground terminal, and an output terminal connected to the other terminal of the first resistor.

The second-order filter path may include a second capacitor connected between the first input node and the ground terminal.

The third-order filter path may include: a third resistor connected between the first input node and an output node; and a third capacitor connected between the output node and the ground terminal.

The current ratio of the first and second currents may be variable.

The first-order filter path may include: a first variable resistor having one terminal connected to the first input node; a first capacitor connected between the second input node and the ground terminal; and an operational amplifier having input terminals connected to the second input node and the ground terminal, and an output terminal connected to the other terminal of the first variable resistor.

The second-order filter path may include a second capacitor connected between the first input node and the ground terminal, and the second capacitor may have the same element value as the first capacitor.

The third-order filter path may include: a third variable resistor connected between the first input node and an output node; and a third capacitor connected between the output node and the ground terminal. The third variable resistor may have an element value which is k times smaller than the element value of the first variable resistor (where k is a scaling factor to allow the loop filter to generate two pole frequencies having the same frequency value). Third capacitor may have an element value which is k times larger than the element value of the first capacitor (where k is a scaling factor to allow the loop filter to generate two pole frequencies having the same frequency value).

A phase margin of the loop filter may be determined by adjusting the element value of the variable resistor in a coarse tuning manner, and adjusting the current ratio of the first and second currents in a fine tuning manner.

According to another aspect of the present invention, there is provided a phase locked loop including: a phase detector detecting a phase difference between a reference frequency and a division frequency; a dual charge pump outputting a first current having a current value proportional to the phase difference, and a second current having a current value reduced by n times the first current (where n is a natural number); a loop filter including an operational amplifier generating an output impedance by increasing by as much as n times an impedance of the second input node to which the second current is applied, and generating a control voltage by filtering the first current applied to the first input node by using the operational amplifier; a voltage controlled oscillator changing an output frequency in response to the control voltage; and a divider dividing the output frequency by N and generating the division frequency.

The loop filter may include: a first-order filter path including a first resistor having one terminal connected to the first input node, a first capacitor connected between the second input node and a ground terminal, and an operational amplifier having a noninverting (+) terminal connected to the second input node, an inverting (−) terminal connected to the ground terminal, and an output terminal connected to the other terminal of the first resistor, the first-order filter path performing a first-order filtering on the first current applied to the first input node; a second-order filter path including a second capacitor connected between the first input node and the ground terminal, the second-order filter path performing a second-order filtering on the first current applied to the first input node; and a third-order filter path including a third resistor connected between the first input node and an output node, and a third capacitor connected between the output node and the ground terminal, the third-order filter path performing a third-order filtering on the first current applied to the first input node.

The second capacitor may have the same element value as the first capacitor, the third variable resistor may have an element value which is k times smaller than the element value of the first variable resistor (where k is a scaling factor to make the loop filter generate two pole frequencies having the same frequency value), and the third capacitor may have an element value which is k times larger than the element value of the first capacitor.

A phase margin of the loop filter may be determined by adjusting the element value of the first variable resistor in a coarse tuning manner, and adjusting the current ratio of the first and second currents in a fine tuning manner.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
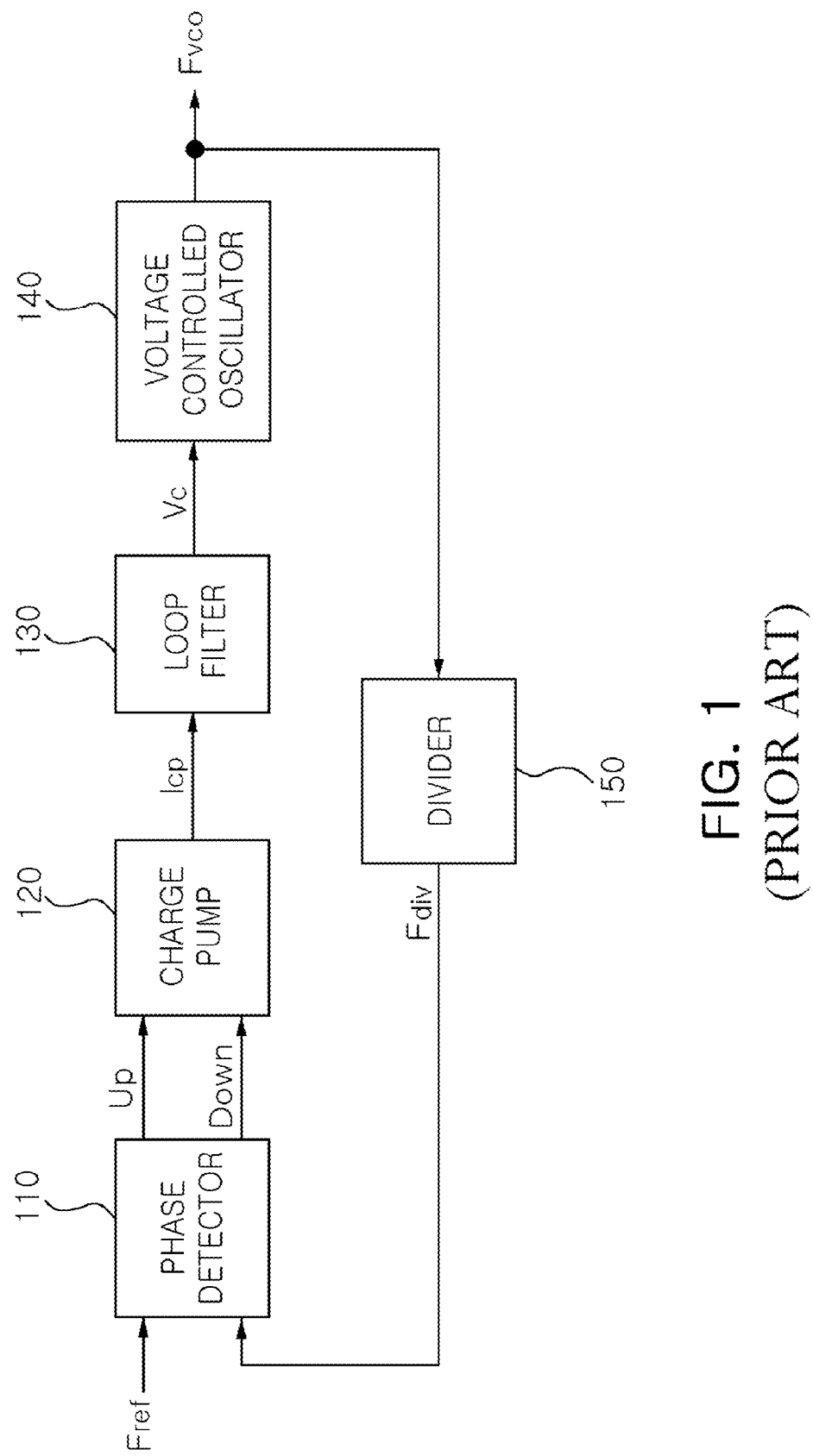
FIG. 1 is a block diagram of a general phase locked loop.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

It will be understood that when an element is referred to as being "connected to" another element, it can be directly connected to the other element or intervening elements may also be present. In contrast, when an element is referred to as being "directly connected to" another element, there are no intervening elements present. In addition, unless explicitly described to the contrary, the word "comprise" and variations such as "comprises" or "comprising," as well as the word "include" and variations such as "includes" and "including," will be understood to imply the inclusion of stated elements but not the exclusion of any other elements.

Figure 3:
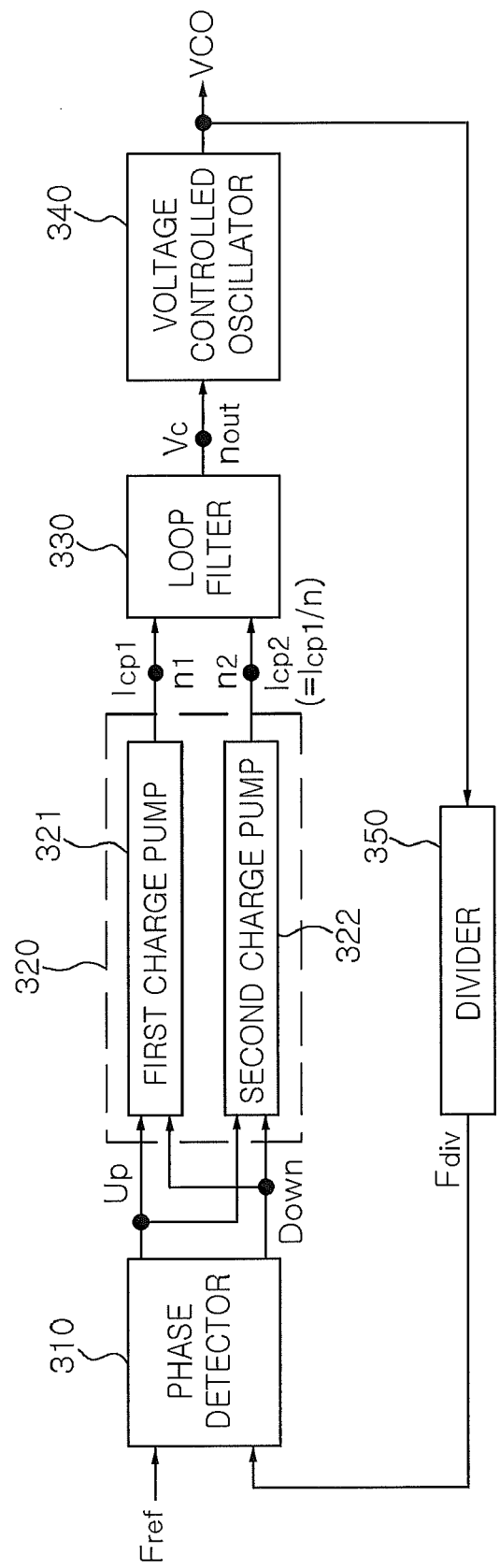
FIG. 3 is block diagram of a phase locked loop according to an embodiment of the present invention.

FIG. 3 is a block diagram of a phase locked loop according to an embodiment of the present invention.

Referring to FIG. 3, a phase locked loop according to an embodiment of the present invention includes a phase detector 310, a dual charge pump 320, a loop filter 330, a voltage controlled oscillator 340, and a divider 350. The phase detector 310 detects a phase difference between a reference frequency $F_{ref}$ and a division frequency $F_{div}$. The dual charge pump 320 outputs a first current $I_{cp1}$ having a current value proportional to the phase difference, and a second current $I_{cp2}$ having a current value reduced by n times the first current $I_{cp1}$ (where n is a natural number). The loop filter 330 includes an operational amplifier which generates an output impedance by increasing an impedance of a second input node $n_2$, to which the second current $I_{cp2}$ is applied, by n times. The loop filter 330 generates a control voltage $V_c$ by filtering the first current $I_{cp1}$ applied to a first input node $n_1$. The voltage controlled oscillator 340 changes an output frequency $F_{VCO}$ in response to the control voltage $V_c$. The divider 350 generates the division frequency $F_{div}$ by dividing the output frequency $F_{VCO}$ by N, and provides the division frequency $F_{div}$ to the phase detector 310.

The dual charge pump 320 includes a first charge pump 321 and a second charge pump 322. The first charge pump 321 and the second charge pump 322 output the first current $I_{cp1}$ and the second current $I_{cp2}$ having a current ratio of n. The first charge pump 321 may generate the first current $I_{cp1}$ having the same current value as the output current $I_{cp}$ of the conventional charge pump 120, and the second charge pump 322 may generate the second current $I_{cp2}$ reduced by n times the first current $I_{cp1}$.

Like the conventional loop filter, the loop filter 330 is implemented with a third-order passive filter. However, the first capacitor $C_1$ of the conventional loop filter is replaced with a first capacitor $C_{21}$ and an operational amplifier 210, so that the capacitance of the first capacitor $C_{21}$ is reduced by n times as compared to the first capacitor $C_1$ of the conventional loop filter.

That is, the area occupied by the first capacitor $C_{21}$ of the loop filter 330 is reduced by n times as compared to the conventional art, and it is advantageous to on-chip integration as much.

Figure 4:
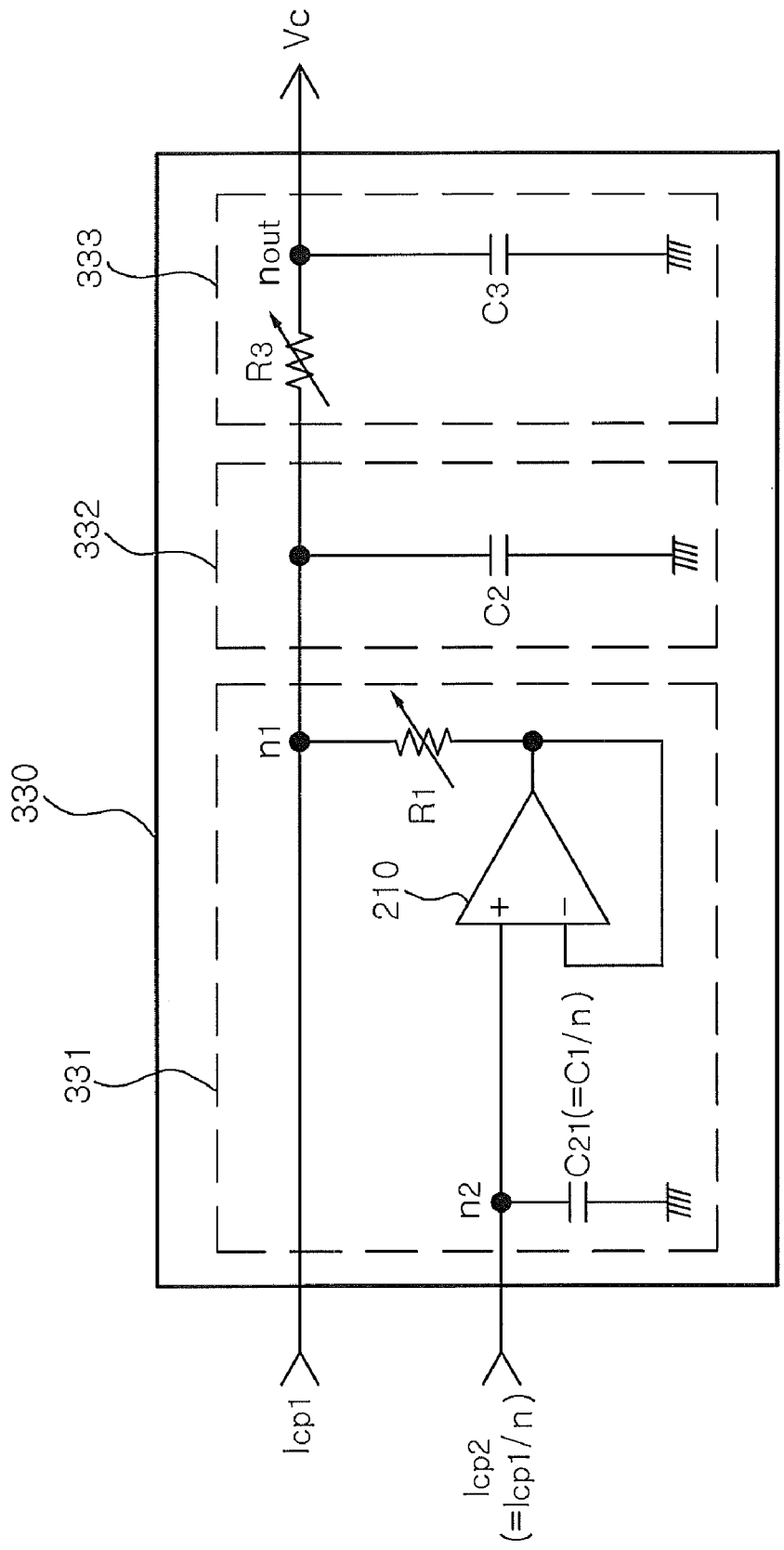
FIG. 4 is a circuit diagram of a loop filter according to an embodiment of the present invention.

FIG. 4 is a circuit diagram of the loop filter according to an embodiment of the present invention.

Referring to FIG. 4, the loop filter according to the embodiment of the present invention is implemented with a third-order active filter. Specifically, the loop filter includes a first-order filter path 331, a second-order filter path 332, and a third-order filter path 333. The first-order filter path 331 includes a first resistor $R_1$ having one terminal connected to the first input node $n_1$, a first capacitor $C_{21}$ connected between the second input node $n_2$ and the ground terminal, and an operational amplifier 210 having a noninverting terminal (+ terminal) connected to the second input terminal $n_2$, and an inverting terminal (− terminal) and an output terminal both connected to the other terminal of the first resistor $R_1$. The first-order filter path 331 performs a first-order filtering on the first current $I_{cp1}$ applied to the first input node $n_1$. The second-order filter path 332 includes a second capacitor $C_2$ connected between the first input node $n_1$ and the ground terminal. The second-order filter path 332 performs a second-order filtering on the first current $I_{cp1}$ applied to the first input node $n_1$. The third-order filter path 333 includes a third resistor $R_3$ connected between the first input node $n_1$ and the output node $n_{out}$, and a third capacitor $C_3$ connected between the output node $n_{out}$ and the ground terminal. The third-order filter path 333 performs a third-order filtering on the first current $I_{cp1}$ applied to the first input node $n_1$. The operational amplifier 210 may be implemented with a voltage follower having a voltage gain of 1.

While the conventional loop filter has a transfer function (LF(s)), a zero frequency ($\omega_z$), and a pole frequency ($\omega_p$), which are expressed as Equation (1) below, the loop filter of FIG. 4 has a transfer function ($LF_1(s)$), a zero frequency ($\omega_{z1}$), and a pole frequency ($\omega_p$), which are expressed as Equation (2) below.

$$LF(s) \cong \frac{1}{sC_1} \cdot \frac{R_1 C_1 s + 1}{(1 + R_1 C_2 s)(1 + R_s C_s s)} \quad (1)$$

$$\omega_z = \frac{1}{R_1 C_1}$$

$$\omega_p = \frac{1}{R_1 C_2}$$

$$LF_1(s) \cong \frac{1}{nC_{21}s} \cdot \frac{nR_1 C_{21} s + 1}{(1 + R_1 C_{21} s)(1 + R_s C_s s)} \quad (2)$$

$$\omega_{z1} = \frac{1}{nR_1 C_{21}}$$

$$\omega_{p1} = \frac{1}{R_1 C_2}$$

As can be seen from Equations (1) and (2), while the zero frequency ($\omega_z$) of the conventional loop filter is $1/(R_1 C_1)$, the zero frequency ($\omega_{z1}$) in the loop filter according to the embodiment of the present invention is $1/(nR_1 C_{21})$. Thus, the first capacitor $C_{21}$ may have an element value reduced by a current ratio n of the first and second currents $I_{cp1}$ and $I_{cp2}$, as compared to the first capacitor $C_1$ of the conventional loop filter.

On the other hand, since the first resistor $R_1$ has an influence on the pole frequency ($\omega_p$) as well as the zero frequency ($\omega_z$), it has the same element value as in the conventional loop filter.

Figure 5:
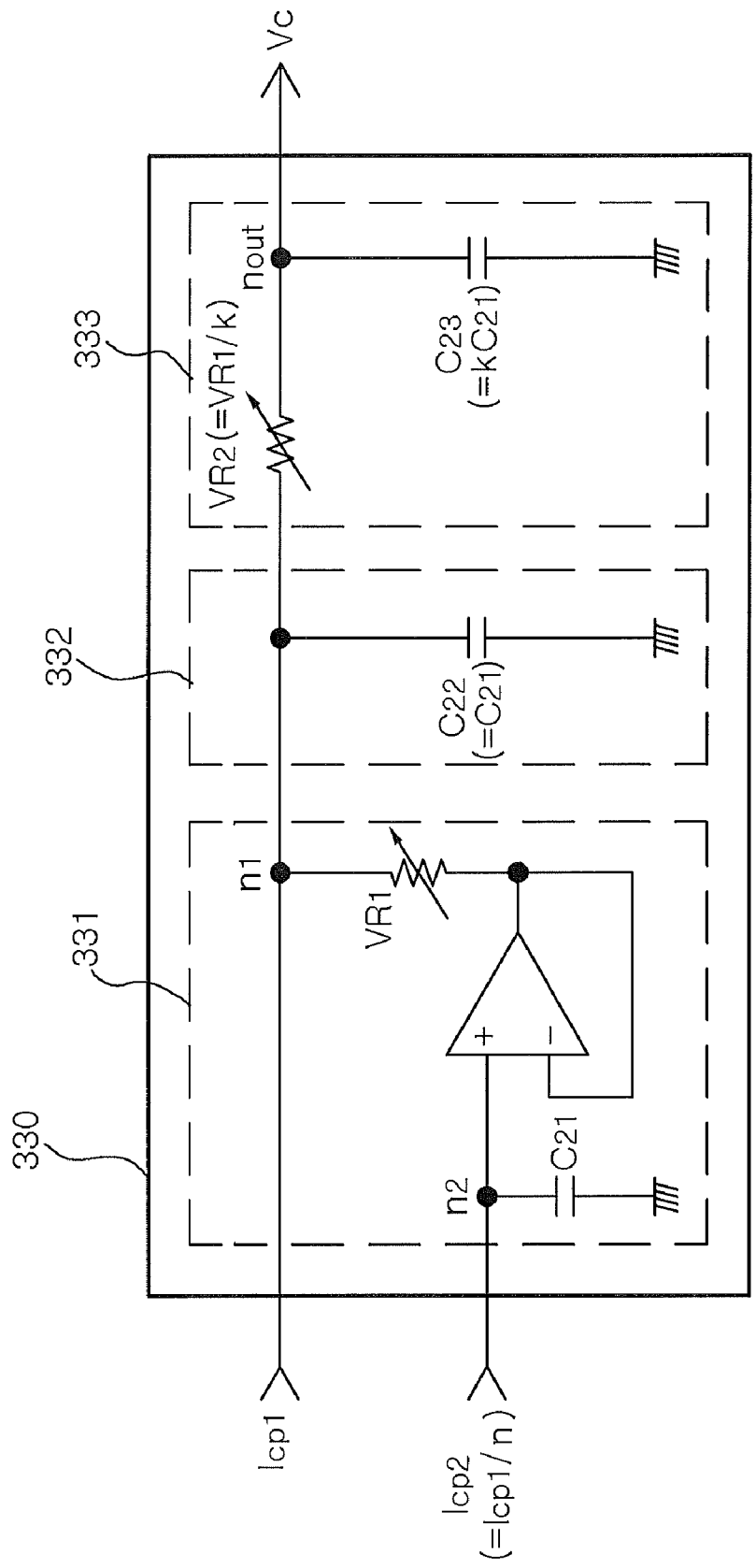
FIG. 5 is a circuit diagram of a loop filter according to another embodiment of the present invention.

The construction of the loop filter of FIG. 4 may be partially modified as illustrated in FIG. 5. In this case, the area of the loop filter may be reduced, and an optimal phase margin may be obtained, without regard to variations in process and temperature when the loop filter is integrated.

FIG. 5 is a circuit diagram of a loop filter according to another embodiment of the present invention.

The loop filter of FIG. 5 is implemented with a third-order active filter, which is similar to the loop filer of FIG. 4. Specifically, the loop filter includes a first-order filter path 331, a second-order filter path 332, and a third-order filter path 333. The first-order filter path 331 includes a first variable resistor $VR_1$ having one terminal connected to a first input node $n_1$, a first capacitor $C_{21}$ connected between a second input node $n_2$ and a ground terminal, and an operational amplifier having a noninverting terminal (+ terminal) connected to the second input node $n_2$, and an inverting terminal (− terminal) and an output terminal both connected to the other terminal of the first variable resistor $VR_1$. The first-order filter path 331 performs a first-order filtering on the first current $I_{cp1}$ applied to the first input node $n_1$. The second-order filter path 332 includes a second capacitor $C_{22}$ connected between the first input node $n_1$ and the ground terminal. The second-order filter path 332 performs a second-order filtering on the first current $I_{cp1}$ applied to the first input node $n_1$. The third-order filter path 333 includes a third variable resistor $VR_2$ connected between the first input node $n_1$ and the output node $n_{out}$, and a third capacitor $C_{23}$ connected between the output node $n_{out}$ and the ground terminal. The third-order filter path 333 performs a third-order filtering on the first current $I_{cp1}$ applied to the first input node $n_1$.

A this time, the dual charge pump 320 provides the loop filter with the first current $I_{cp1}$ and the second current $I_{cp2}$, whose current ratio n is changed.

The second capacitor $C_{22}$ connected to the output path of the first current $I_{cp1}$ has the same element value as the first capacitor $C_{21}$ connected to the output path of the second current $I_{cp2}$. That is, the second capacitor $C_{22}$ has an element value ($C_1/N$) which is reduced by the current ratio n of the first current $I_{cp1}$ and the second current $I_{cp2}$ as compared to the first capacitor $C_1$ of the conventional loop filter. This is done for reducing a mismatch characteristic between elements, which may occur when the element values of the first and second capacitors $C_{21}$ and $C_{22}$ are different from each other.

Two pole frequencies may be generated according to characteristics of the third-order passive filter. The third variable resistor $VR_3$ and the third capacitor $C_{23}$ are designed to have element values of $VR_1/k$ and $kC_{21}$ (where k is a scaling factor for canceling the poles, k>1), respectively. This is done in order that the two pole frequencies which may be generated by the third-order loop filter have the same value. That is, this is done in order that the loop filter has a single pole frequency.

The loop filter of FIG. 5 has a transfer function ($LF_2(s)$) expressed as Equation (3) below. Thus, like the loop filter of FIG. 4, the loop filter of FIG. 5 can include the first capacitor $C_{21}$ having an element value reduced by the current ratio n of the first current $I_{cp1}$ and the second current $I_{cp2}$.

$$LF_2(s) \cong \frac{1}{nC_{21}s} \cdot \frac{nVR_1C_{21}s + 1}{(1 + nVR_1C_{21}s)^2} \quad (3)$$

The phase locked loop using the conventional loop filter has an open loop characteristic equation (OLG(s)), an open loop unit gain frequency ($\omega_c$), a pole frequency ($\omega_p$), and a zero frequency ($\omega_z$), which are expressed as Equation (4) below. Meanwhile, the phase locked loop using the loop filter of FIG. 5 has an open loop characteristic equation ($OLG_2(s)$), an open loop unit gain frequency ($\omega_{c2}$), a pole frequency ($\omega_{p2}$), and a zero frequency ($\omega_{z2}$), which are expressed as Equation (5) below.

$$OLG(s) \cong \frac{I_{cp}K_{VCO}}{2\pi N} \cdot \frac{R_1C_1s + 1}{sC_1(1 + R_1C_2s)(1 + R_sR_ss)} \quad (4)$$

$$\omega_c = \frac{I_{cp}K_{VCO}R_1}{2\pi N}$$

$$\omega_z = \frac{1}{R_1C_1}$$

$$\omega_p = \frac{1}{R_1C_2}$$

$$OLG(s) \cong \frac{I_{cp2}K_{VCO}}{2\pi N} \cdot \frac{nVR_1C_{21}s + 1}{sC_{21}s(1 + VR_1C_{21}s)^2} \quad (5)$$

$$\omega_{c2} = \frac{I_{cp1}K_{VCO}VR_2}{2\pi N}$$

$$\omega_{z2} = \frac{1}{VR_1C_{21}}$$

$$\omega_{p2} = \frac{1}{VR_1C_{22}}$$

where $K_{VCO}$ represents a VCO gain, and N represents the division ratio.

As expressed in Equations (4) and (5), the open loop unit gain frequencies $\omega_c$ and $\omega_{c2}$ of the loop filters are proportional to the first resistor $R_1$ and the first variable resistor $VR_1$.

Figure 6:
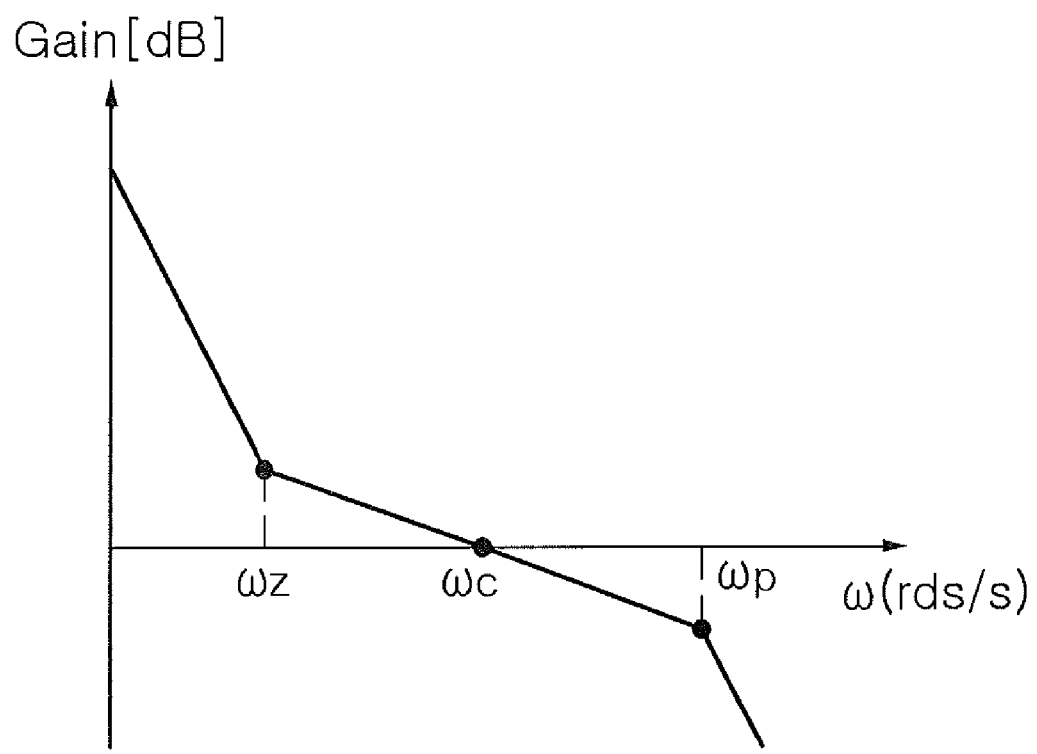
FIG. 6 is a graph showing an open loop characteristic of a phase locked loop when it has an optimal phase margin.

In addition, as illustrated in FIG. 6, the open loop unit gain frequencies $\omega_c$, and $\omega_{c2}$ of the loop filters have the same spacing from the pole frequency $\omega_p$ and the zero frequency $\omega_z$.

Figure 7A:
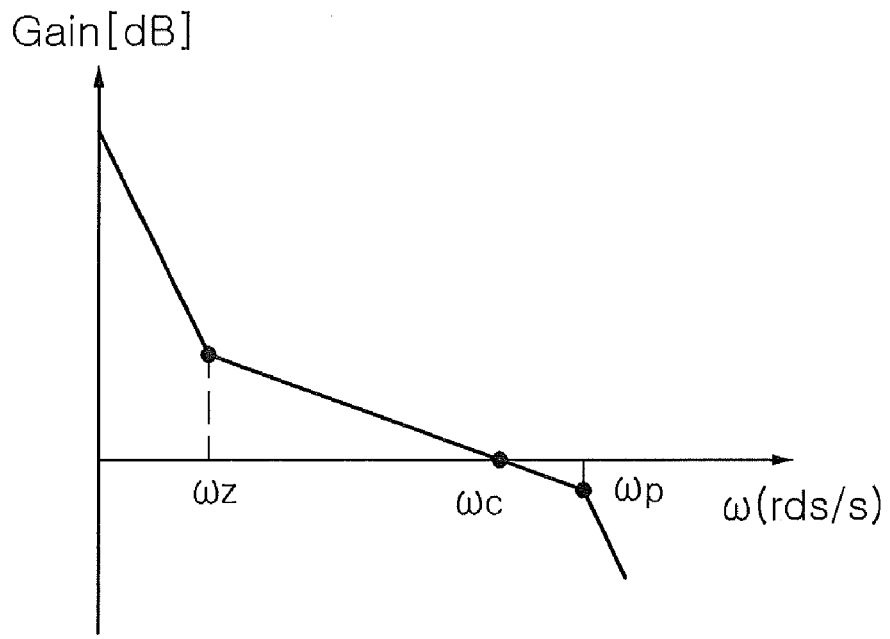
FIGS. 7A and 7B are graphs showing an open loop characteristic of a conventional phase locked loop.

However, in the case of using the conventional loop filter, the element value of the first resistor $R_1$ increases by 20% due to variations in process and temperature during the integration of the circuit, the pole frequency $\omega_p$ and the zero frequency $\omega_z$ decrease, and the unit gain frequency $\omega_c$ increases. Consequently, as illustrated in FIG. 7A, a distance between the unit gain frequency $\omega_c$ and the pole frequency $\omega_p$ is reduced and a phase margin is deteriorated.

Figure 7B:
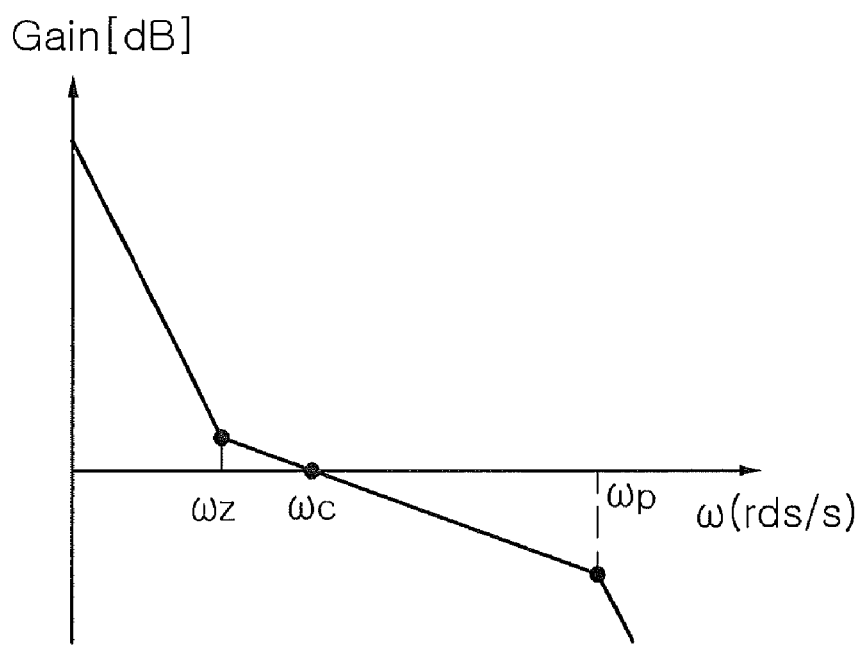

In addition, as illustrated in FIG. 7B, even though the element values of the first and second capacitors $C_1$ and $C_2$ decrease or increase by 20%, the position of the pole frequency $\omega_p$ or the zero frequency $\omega_z$, is shifted by 20% in a direction of the unit gain frequency $\omega_c$, and a phase margin is deteriorated.

As a result, when the conventional loop filter is integrated without separate tuning, the pole frequency $\omega_p$ and the zero frequency $\omega_z$ are shifted by the influence of variations in process and temperature, and accordingly a phase margin of the loop filter is deteriorated.

On the contrary, the loop filter of FIG. 5 may obtain the optimal phase margin, regardless of variations in process and temperature when it is integrated, by adjusting the first variable resistor $VR_1$ and the current ratio n of the first and second currents $I_{cp1}$ and $I_{cp2}$.

As expressed in Equations (3) and (5), the pole frequency $\omega_{p2}$, the zero frequency $\omega_{z2}$, and the open loop unit gain frequency $\omega_{c2}$ of the loop filter illustrated in FIG. 5 are proportional to the first variable resistor $VR_1$.

The positions of the pole frequency $\omega_{p2}$, the zero frequency $\omega_{z2}$, and the open loop unit gain frequency $\omega_{c2}$ are adjusted by calibrating the resistance of the first variable resistor $VR_1$ in a coarse tuning manner, in order that the open loop unit gain frequency $\omega_{c2}$ meets the condition of Equation (6) below. The condition of Equation (6) represents the open loop unit gain frequency $\omega_{c2}$ at which the optimal phase margin characteristic can be obtained. This is the condition at which the slopes of the pole frequency $\omega_{p2}$ and the zero frequency $\omega_{z2}$ are zero when they are differentiated.

$$\omega_{c2} \cong \sqrt{\omega_{p2}\omega_{z2}} \quad (6)$$

Figure 8A:
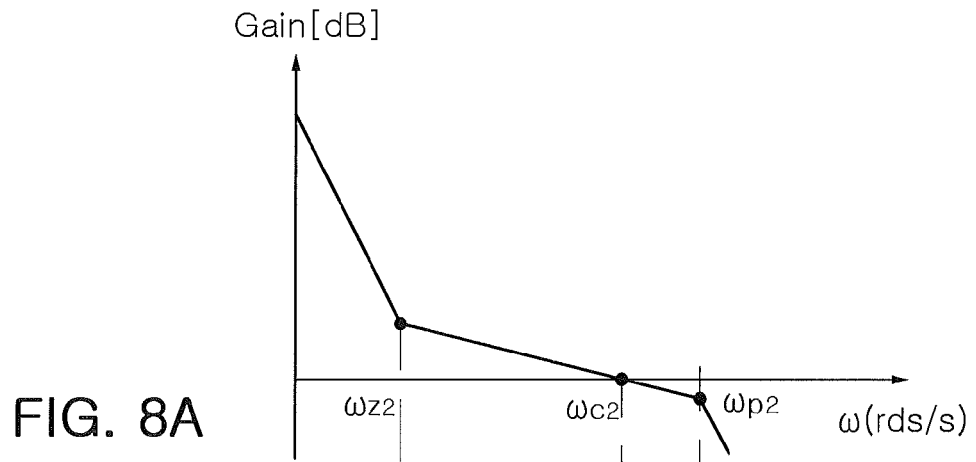
FIGS. 8A to 8C are graph showing an open loop characteristic of a phase locked loop according to another embodiment of the present invention.
Figure 8B:
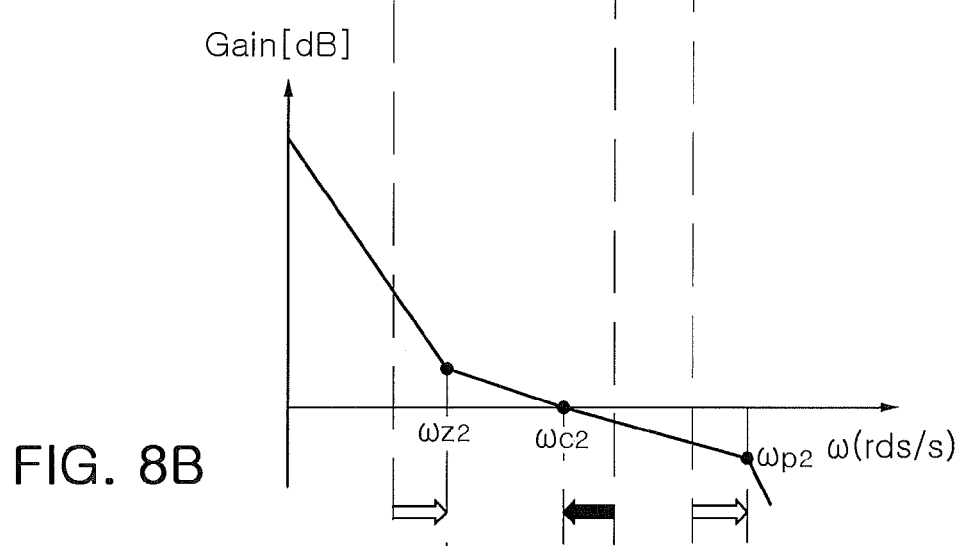

For example, when the open loop unit gain frequency $\omega_{c2}$ and the pole frequency $\omega_{p2}$ are close, as illustrated in FIG. 8A, the resistance of the first variable resistor $VR_1$ is lowered in order that the open loop unit gain frequency $\omega_{c2}$ is located and fixed at the frequency position meeting Equation (6). In this case, the resistance of the second variable resistor $VR_2$ is also adjusted and fixed in proportion to the resistance of the first variable resistor $VR_1$.

Figure 8C:
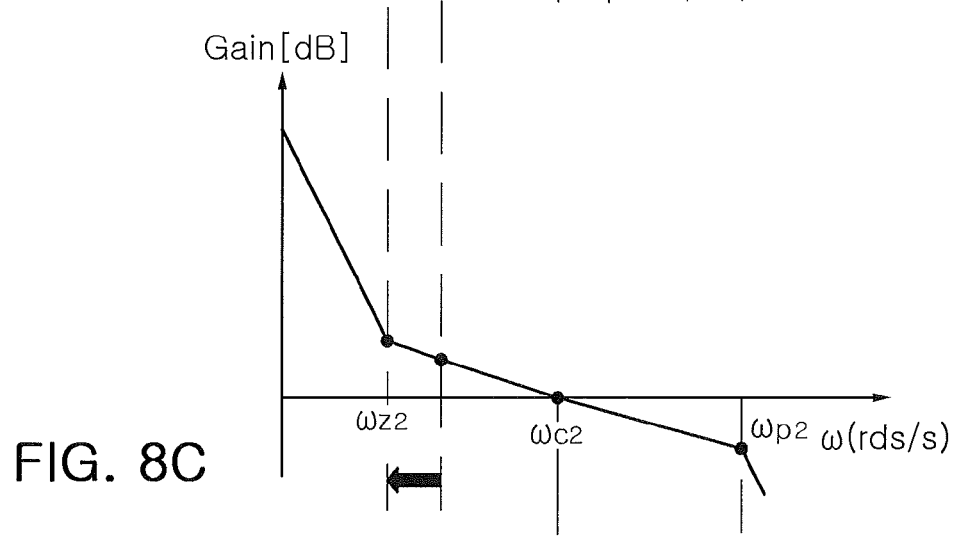

When the resistance adjustment of the first and second variable resistors $VR_1$ and $VR_2$ is completed, the current ratio n of the first and second currents $I_{cp1}$ and $I_{cp2}$ are adjusted in a fine tuning manner, so that a slightly distorted phase margin characteristic is additionally tuned as illustrated in FIG. 8C.

Accordingly, the loop filter of FIG. 5 may obtain an optimal phase margin characteristic, even though 20% process error occurs, by adjusting the first and second variable resistors $VR_1$ and $VR_2$ and the current ratio n of the first and second currents $I_{cp1}$ and $I_{cp2}$.

Table 1 below shows the element values of the passive loop filter of FIG. 2, the element values of the loop filter of FIG. 4, and the element values of the loop filter of FIG. 5 in order to obtain the phase margin of 60 degrees and the open loop unit gain frequency of 30 KHz when the frequency $F_{VCO}$ to be mixed in the phase looked loop, the reference frequency $F_{ref}$, the division ratio n, the VCO gain $K_{VCO}$, and the reference current $I_{cp1}$ of the dual charge pump are designed to be 2 GHz, 2 MHz, 80, 50 MHz/V, and 20 µA, respectively.

Figure 2:
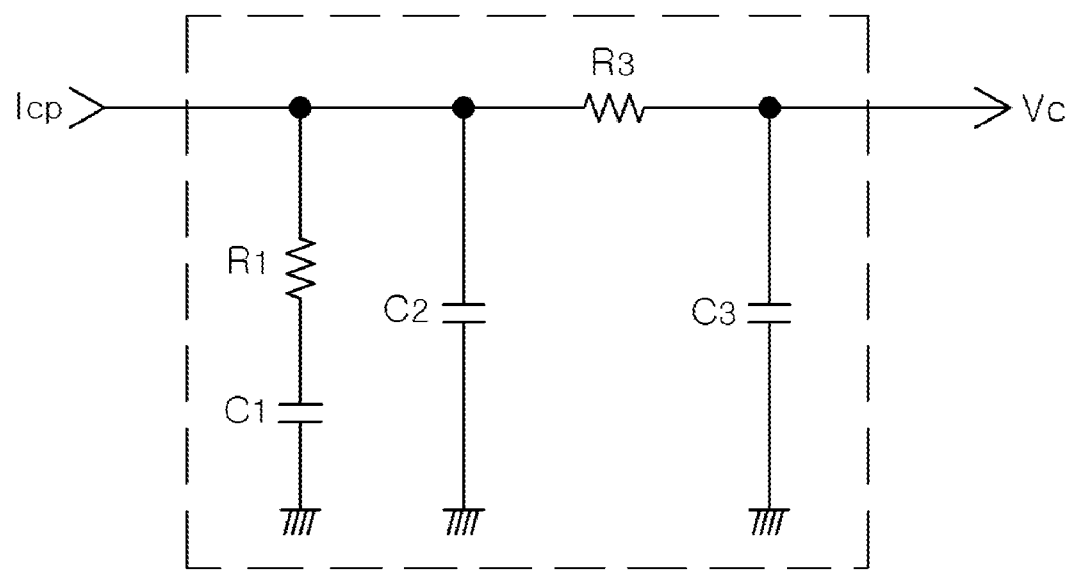
FIG. 2 is a circuit diagram of a conventional loop filter.

Since the loop filter of FIG. 2 includes the first capacitor $C_1$ requiring the capacitance of 1 nF, it requires a large area when it is integrated. On the contrary, since the loop filter of FIG. 4 includes the first capacitor $C_{21}$ requiring the capacitance of 100 pF, which is reduced by the dual charge pump current ratio n, it requires a small area when it is integrated.

The loop filter of FIG. 5 may perform the operation of tuning the resistance of the variable resistor and adjusting the current ratio of the dual charge pump. Therefore, the loop filter of FIG. 5 may reduce the capacitance of the first capacitor $C_{21}$ to 80 nF and meet the optimal phase margin condition even though the element value of the loop filter changes as much as 20% when it is integrated.

TABLE 1

Phase margin: 60 degrees, Open loop unit gain frequency: 30 KHZ, Loop band: 50 KHz, $F_{VCO}$ = 2 GHz, $F_{ref}$ = 25 MHz, N = 80, $K_{VCO}$ = 50 MHz, $I_{cp1}$ = 20 μA

| | Element Value | | |
|---|---|---|---|
| | LF (FIG. 2) | LF1 (FIG. 4) | LF2 (FIG. 5) |
| Current Ratio | — | 10 | 12.5 |
| First (Variable) Resistor | 17 kΩ | 17 kΩ | 8.5 kΩ-34 kΩ |
| First Capacitor | 1 nF | 100 pF | 80 pF |
| Second Capacitor | 80 pF | 80 pF | 80 pF |
| Scaling Factor (k) | — | 2 | 2 |
| Second (Variable) Resistor | 8.5 kΩ | 8.5 kΩ | 4.25 kΩ-17 kΩ |
| Third Capacitor | 160 pF | 160 pF | 160 pF |

As set forth above, according to exemplary embodiments of the invention, by replacing the charge pump and the first capacitor having a large element value included in the conventional loop filter with the dual charge pump, the first capacitor having a large element value, and the operational amplifier, the chip area may be reduced up to 50% or more while providing the same performance as the conventional loop filter. Thus, the phase locked loop including the loop filter according to the embodiment of the present invention is more advantageous to on-chip integration.

Furthermore, even though process and temperature are changed when the loop filter is integrated, the loop filter may actively adjust the pole frequency, the zero frequency, and the open loop unit gain frequency, thereby obtaining the optimal phase margin.

While the present invention has been shown and described in connection with the exemplary embodiments, it will be apparent to those skilled in the art that modifications and variations can be made without departing from the spirit and scope of the invention as defined by the appended claims.

What is claimed is:

1. A loop filter receiving first and second current respectively via first and second input nodes, the first and second current having a current ratio of n, n being a natural number, comprising:
   a first-order filter path including an operational amplifier, the first-order filter path performing a first-order filtering on the first current using the operational amplifier;
   a second-order filter path performing a second-order filtering on the first current; and
   a third-order filter path performing a third-order filtering on the first current, wherein
   the current ratio n of the first current to the second current is variable.

2. The loop filter of claim 1, wherein the first-order filter path comprises:
   a first variable resistor having one terminal connected to the first input node;
   a first capacitor connected between the second input node and a ground terminal; and
   an operational amplifier having a non-inverting input terminal, an inverting input terminal and an output terminal, the non-inverting input terminal being connected to the second input node, the inverting input terminal and the output terminal being connected to the other terminal of the first variable resistor.

3. The loop filter of claim 2, wherein the operational amplifier has a voltage follower structure having a voltage gain of 1.

4. The loop filter of claim 2, wherein the second-order filter path comprises a second capacitor connected between the first input node and the ground terminal.

5. The loop filter of claim 4, wherein the second capacitor has the same element value as the first capacitor.

6. The loop filter of claim 5, wherein the third-order filter path comprises:
   a third variable resistor connected between the first input node and an output node; and
   a third capacitor connected between the output node and the ground terminal.

7. The loop filter of claim 6, wherein the third variable resistor has an element value which is k times smaller than the element value of the first variable resistor, k being a scaling factor to make the loop filter generate two pole frequencies having the same frequency value.

8. The loop filter of claim 7, wherein the third capacitor has an element value which is k times larger than the element value of the first capacitor, k being a scaling factor to make the loop filter generate two pole frequencies having the same frequency value.

9. The loop filter of claim 6, wherein a phase margin of the loop filter is determined by adjusting the element value of the variable resistor in a coarse tuning manner, and adjusting the current ratio of the first and second currents in a fine tuning manner.

10. A phase locked loop, comprising:
    a phase detector detecting a phase difference between a reference frequency and a division frequency;
    a dual charge pump outputting a first current having a current value proportional to the phase difference, and a second current having a current value reduced by n times the first current, n being a natural number;
    a loop filter including an operational amplifier for generating a control voltage by filtering the first current applied to a first input node using the operational amplifier;
    a voltage controlled oscillator changing an output frequency in response to the control voltage; and
    a divider dividing the output frequency by N and generating the division frequency, wherein
    the current ratio n of the first current to the second current is variable.

11. The phase locked loop of claim 10, wherein the loop filter comprises:
    a first-order filter path including a first variable resistor having one terminal connected to the first input node, a first capacitor connected between the second input node and a ground terminal, and the operational amplifier having a noninverting (+) input terminal connected to the second input node, and an inverting (−) input terminal and an output terminal both connected to the other terminal of the first variable resistor, the first-order filter path performing a first-order filtering on the first current applied to the first input node;
    a second-order filter path including a second capacitor connected between the first input node and the ground terminal, the second-order filter path performing a second-order filtering on the first current applied to the first input node; and
    a third-order filter path including a third variable resistor connected between the first input node and an output node, and a third capacitor connected between the output node and the ground terminal, the third-order filter path performing a third-order filtering on the first current applied to the first input node.

12. The phase locked loop of claim 11, wherein
the second capacitor has the same element value as the first capacitor,
the third variable resistor has an element value which is k times smaller than the element value of the first variable resistor, k being a scaling factor to make the loop filter generate two pole frequencies having the same frequency value, and
the third capacitor has an element value which is k times larger than the element value of the first capacitor.

13. The phase locked loop of claim 12, wherein a phase margin of the loop filter is determined by adjusting the element value of the first variable resistor in a coarse tuning manner, and adjusting the current ratio of the first and second currents in a fine tuning manner.

* * * * *